United States Patent
Ray et al.

(10) Patent No.: US 10,540,733 B2
(45) Date of Patent: Jan. 21, 2020

(54) FRAMELESS RANDOM-ACCESS IMAGE SENSING

(71) Applicant: THE BOEING COMPANY, Chicago, IL (US)

(72) Inventors: Gary A. Ray, Issaquah, WA (US); Bentley E. Northon, Albuquerque, NM (US)

(73) Assignee: The Boeing Company, Chicago, IL (US)

( * ) Notice: Subject to any disclaimer, the term of this patent is extended or adjusted under 35 U.S.C. 154(b) by 163 days.

(21) Appl. No.: 15/814,803

(22) Filed: Nov. 16, 2017

(65) Prior Publication Data

US 2019/0147560 A1   May 16, 2019

(51) Int. Cl.
  *G06T 1/00*   (2006.01)
  *H01L 27/148*   (2006.01)
  *G01J 1/44*   (2006.01)

(52) U.S. Cl.
  CPC .......... *G06T 1/0007* (2013.01); *H01L 27/148* (2013.01); *G01J 1/44* (2013.01)

(58) Field of Classification Search
  CPC .. G06T 1/0007; H04N 5/341; H04N 5/37455; H01L 27/148; G01J 1/44
  See application file for complete search history.

(56) References Cited

U.S. PATENT DOCUMENTS

| 5,452,004 A * | 9/1995 | Roberts | H04N 3/155 348/301 |
| 2003/0058356 A1 | 3/2003 | DiCarlo et al. | |
| 2009/0040349 A1* | 2/2009 | Xu | H04N 5/23245 348/302 |
| 2018/0225521 A1* | 8/2018 | Harris | G01S 17/026 |

FOREIGN PATENT DOCUMENTS

WO    WO9501048 A1    1/1995

OTHER PUBLICATIONS

Schultz et al., "Digital-Pixel Focal Plane Array Technology," vol. 20, No. 2, 2014, Lincoln Laboratory Journal, pp. 36-51.
Yazici et al., "Design of a ROIC for Scanning Type HgCdTe LWIR Focal Plane Arrays," Sabanci University, Faculty of Engineering and Natural Sciences, Istanbul, Turkey, Infrared Technology and Applications XXXVI, Proc. of SPIE vol. 7660, 76603X, 2010, 8 pages.
Singh, "DDR3: A Comparative Study," EDN Network, Jun. 18, 2013, 12 pages.
Rider et al., "Fast Imaging Detector Readout Circuits with In-Pixel ADCs for Fourier Transform Imaging Spectrometers," Jet Propulsion Laboratory, California Institute of Technology, Pasadena, CA, 2011, 4 pages.
(Continued)

*Primary Examiner* — Phuoc Tran
(74) *Attorney, Agent, or Firm* — Yee & Associates, P.C.

(57) ABSTRACT

A method and apparatus for frameless random-access image sensing. Instructions identifying a pixel detector in an array of pixel detectors and integration instructions for the pixel detector may be received by an image detector controller. Integration by the pixel detector may be controlled as defined by the integration instructions to generate pixel data by the pixel detector. The pixel data may be read from the pixel detector.

20 Claims, 9 Drawing Sheets

(56) References Cited

OTHER PUBLICATIONS

Pastorelli et al., "ADC Techniques for Optimized Conversion Time in CMOS Image Sensors," Society for Imaging Science and Technology, IS&T International Symposium on Electronic Imaging 2016, IMSE-268.1, 6 pages.
European Patent Office Extended Search Report, dated Feb. 11, 2019, regarding Application No. 18206358.6, 10 pages.
Yadid-Pecht et al., "A Random Access Photodiode Array for Intelligent Image Capture," IEEE Transactions on Electron Devices, vol. 38, No. 8, Aug. 1991, pp. 1772-1780.

* cited by examiner

FRAMELESS RANDOM-ACCESS IMAGE SENSING

BACKGROUND INFORMATION

1. Field

The present disclosure relates generally to image sensing. More particularly, the present disclosure relates to an imaging system and method in which pixel detectors in an array may be individually addressed and controlled.

2. Background

A focal plane array (FPA) is an image sensing device consisting of an array of light-sensing elements at the focal plane of a lens. A focal plane array may also be known as a staring array. The light-sensing elements in a focal plane array correspond to picture elements, commonly called pixels, of an image formed by the array of light-sensing elements. For example, without limitation, each light-sensing element in the array of light-sensing elements may generate a pixel of an image formed by the focal plane array. The array of light-sensing elements in a focal plane array may typically be a rectangular array of light-sensing elements.

Focal plane arrays are commonly used for imaging purposes. For example, without limitation, a digital camera on a mobile telephone or other consumer product may use a focal plane array to generate still images and video images. Focal plane arrays may also be used as imaging devices for commercial, scientific, educational, military, and any other appropriate imaging purpose.

Focal plane arrays may also be used for non-imaging purposes. For example, without limitation, focal plane arrays may be used in devices for spectrometry, lidar, and wave-front sensing. Other non-imaging applications of focal plane arrays may include, for example, without limitation, free-space laser communications receiver arrays and infrared threat sensors that may be used to track approaching missiles that may threaten military and commercial aircraft.

Focal plane arrays may be configured to detect light in various different optical frequency ranges. For example, visible FPAs are in almost every cell phone and SLR camera manufactured today. These are typically single chip silicon (Si) CMOS (complementary metal-oxide-semiconductor) or CCD (charge-coupled device) arrays where the detector and its readout circuitry are on the same chip.

Infrared FPAs are used to track "hot" objects such as people in a scene or jet aircraft flying through the air and use more exotic materials for the detectors. In this case the readout integrated circuit (ROIC) may be a separate Si CMOS chip that is joined with the detector array due to the incompatibility of manufacturing two widely different material classes.

The gathering and processing of image data provided by focal plane arrays and other such image detectors may be less than optimal for some applications. Therefore, there may be a need for a method and apparatus that take into account at least some of the issues discussed above, as well as other possible issues.

SUMMARY

In one illustrative embodiment, a method of random-access image sensing comprises receiving instructions identifying a pixel detector in an array of pixel detectors and integration instructions for the pixel detector. Integration by the pixel detector is controlled as defined by the integration instructions to generate pixel data by the pixel detector. The pixel data is read from the pixel detector.

In another illustrative embodiment, an apparatus comprises an image detector controller configured to receive instructions from a data processing system identifying a pixel detector in an array of pixel detectors and integration instructions for the pixel detector, control integration by the pixel detector as defined by the integration instructions to generate pixel data by the pixel detector, and send the pixel data from the pixel detector to the data processing system.

In yet another illustrative embodiment, an apparatus comprises an image detector controller, a computer interface for the image detector controller, and a pixel detector readout circuit for each pixel detector in an array of pixel detectors. The image detector controller is configured to address an individual pixel detector in an image detector comprising an array of pixel detectors to control integration by the pixel detector and to read pixel data from the pixel detector. The image detector controller is configured to receive instructions for obtaining image data from the image detector from a data processing system via the computer interface and to send the image data to the data processing system via the computer interface. The image detector controller is configured to control integration by the pixel detector by writing an integration value to the pixel detector readout circuit for the pixel detector.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives, and features thereof, will best be understood by reference to the following detailed description of an illustrative embodiment of the present disclosure when read in conjunction with the accompanying drawings, wherein:

DETAILED DESCRIPTION

The illustrative embodiments recognize and take into account different considerations. For example, the illustrative embodiments recognize and take into account that the output of FPAs are typically assumed to be images and therefore the FPA produces a single image at each frame time. However, for many applications, the image is not meant to be considered as a single picture, but rather a set of separate images of widely disparate objects of sizes ranging from single pixels to large pixel areas with widely different characteristics (range, brightness, motion, etc.) and ideally should be processed as separate signals with different sample times and different signal-to-noise ratios (SNR). This is impossible with standard FPAs.

Illustrative embodiments recognize and take into account that existing solutions using conventional FPAs typically process pixels on a frame-by-frame basis, rather than on a pixel-by-pixel basis. Thus, sub-optimal processing results since each pixel is essentially processed in the same manner at the same time. While this is normally reasonable when the resulting output of an FPA is treated as a single stationary object with uniform brightness, this ignores the more typical case that each pixel is essentially an independent detector observing a one pixel sized "object". This pixel "object" can have its own range, motion, brightness, etc. and should be processed differently from every other pixel. By contrast, in a conventional FPA, the entire frame is sampled at the same time with the same pixel integration time and sent to a standard processor for further processing at one time. Furthermore, each pixel is only updated once per frame time. Thus, processing that requires some pixels to be sampled more often than others (with shorter integration times), or at different update times with respect to the frame, is not possible for conventional FPAs.

Illustrative embodiments solve this general problem of suboptimal image sensor processing by enabling individual pixel-by-pixel image processing by using a modified design of a readout integrated circuit together with a standard detector array as part of a new focal plane array design.

Illustrative embodiments provide a frameless random-access image sensor (FRAIS). It enables independent pixel-by-pixel sensor processing, which was not possible on existing pixel arrays. The independent processing is enabled by creating the ability to access and control each pixel in a pixel array randomly. This access (both read and write) enables setting of independent pixel shutter time and phase and image capture of all or any portion of the pixel array at any desired rate subject to interface and hardware limitations. Because of its flexible processing, pixels can be processed in many different ways, ranging from a common frame time for all pixels to no frame time at all.

A frameless random-access image sensor in accordance with an illustrative embodiment is able to overcome drawbacks in existing FPAs by enabling pixel-by-pixel sensor processing. Illustrative embodiments provide the ability for each sensor pixel to have a different integration time and integration period. Illustrative embodiments may be implemented by adding only simple circuitry to each pixel beyond an analog-to-digital converter (ADC). For example, illustrative embodiments may be implemented using simple registers and counters with a single global chip clock and output buffer for the entire sensor. Illustrative embodiments may provide the ability to change update rates and phases (with respect to the global clock) of individual pixels using random-access memory-type write operations.

Image processing software that controls a frameless random-access image sensor in accordance with an illustrative embodiment may dynamically process and track different groups of pixels that may represent different single objects using shutter times and phases unique to those objects. Illustrative embodiments provide the ability to access nearby pixels at the full read rate of the interface without boundary problems through use of a multi-plane access method.

Illustrative embodiments provide the ability to integrate a FRAIS sensor with an I/O interface that is similar to standard random-access computer memory, i.e. DDRx SDRAM. Power usage of the ROIC in a frameless random-access image sensor in accordance with an illustrative embodiment is proportional to the number of signals of interest, rather than the sensor size, thus potentially reducing power in many applications.

Illustrative embodiments provide for processing of pixels in images in a wide variety of sequences ranging from a common frame time for all pixels to no frame time at all.

Figure 1:
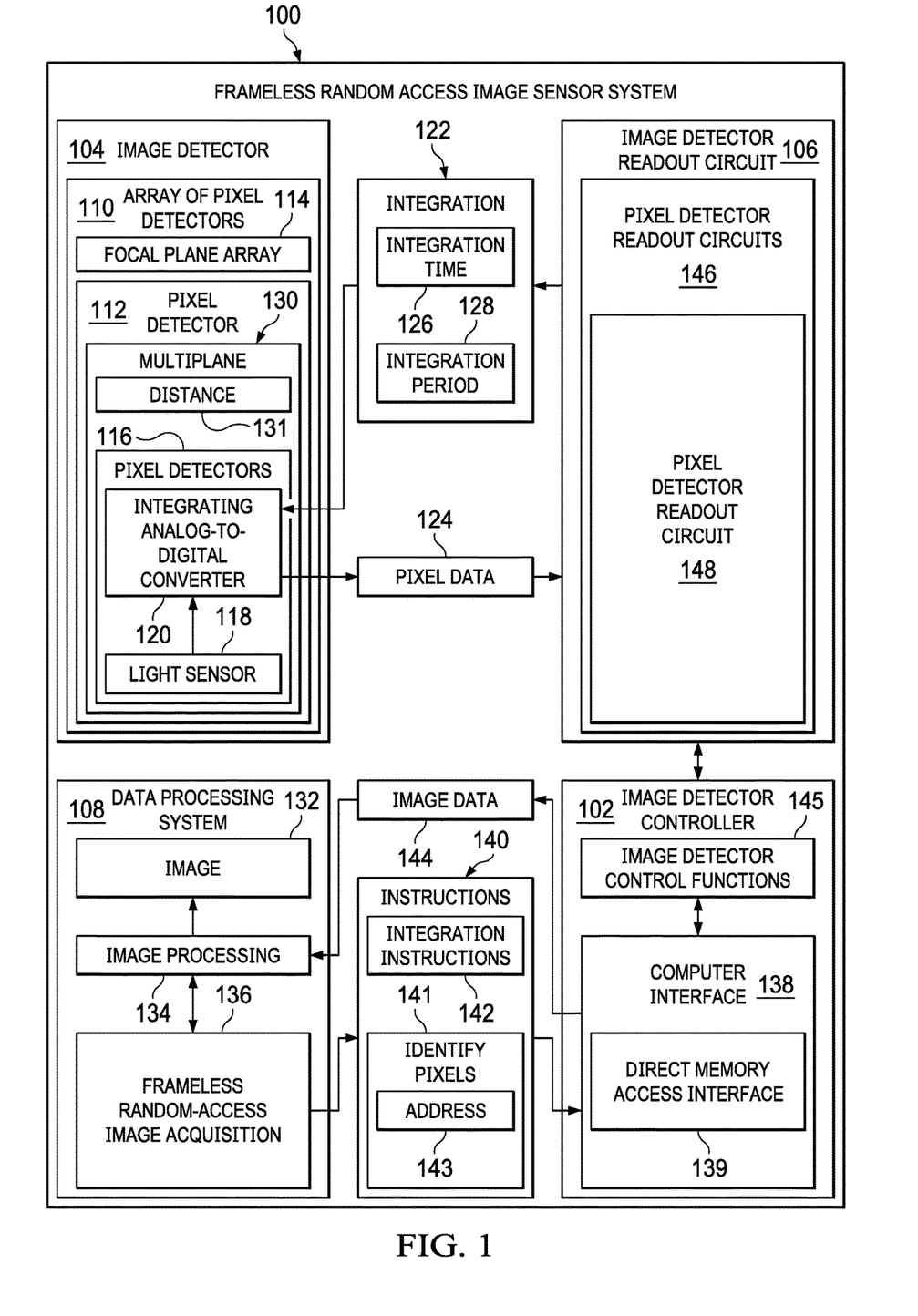
FIG. 1 is an illustration of a block diagram of a frameless random-access image sensor system in accordance with an illustrative embodiment.

Turning to FIG. 1, an illustration of a block diagram of a frameless random-access image sensor system is depicted in accordance with an illustrative embodiment. Frameless random-access image sensor system 100 may comprise image detector controller 102, image detector 104, image detector readout circuit 106, and data processing system 108.

Image detector 104 may comprise array of pixel detectors 110. Array of pixel detectors 110 may comprise plurality of pixel detectors 112 in any appropriate configuration. For example, without limitation, array of pixel detectors 110 may comprise focal plane array 114.

Each pixel detector 116 in array of pixel detectors 110 may comprise light sensor 118 and integrating analog-to-digital converter 120 along with other appropriate circuitry. For example, without limitation, light sensor 118 may comprise any appropriate device that detects photons at particular wavelengths and produces an electrical charge, voltage, or resistance in relation to the number of photons. This charge, voltage, or resistance may then be measured and digitized by integrating analog-to-digital converter 120. For example, without limitation, a photocurrent produced by light sensor 118 may be accumulated and stored in an integrating capacitor that is part of integrating analog-to-digital converter 120. The voltage across the integrating capacitor is thus proportional to the photoelectrons stored over a period of time. The maximum charge stored over the period of time is equal to the product of the total capacitance and the maximum allowable voltage across the capacitor. The circuit may include a low-noise input amplifier between light sensor 118 and the capacitor in integrating analog-to-digital converter 120, to isolate the detector bias from the following unit cell circuits.

In accordance with an illustrative embodiment, each pixel detector 116 in array of pixel detectors 110 may be individually addressable so that integration 122 by each pixel detector 116 may be controlled individually and pixel data 124 from each pixel detector 116 obtained individually. In accordance with an illustrative embodiment, controlling integration 122 of pixel detector 116 may include controlling integration time 126, integration period 128, or both. Integration time 126 is the time at which integrating analog-to-digital converter 120 begins integrating the output from light sensor 118 in pixel detector 116. Integration period 128 is the duration over which integrating analog-to-digital converter 120 integrates the output from light sensor 118 in pixel detector 116 starting at integration time 126. Pixel data 124 is the digital output from pixel detector 116. Pixel data 124 thus represents the integrated output from light sensor 118 as integrated by integrating analog-to-digital converter 120 over integration period 128 starting at integration time 126.

Multiplane 130 may comprise a subset of all of pixel detectors 112 in array of pixel detectors 110. Multiplane 130 may be defined by pixel detector 116 in array of pixel detectors 110 and the group of pixel detectors 112 around pixel detector 116 within a specified distance 131 from pixel detector 116. In accordance with an illustrative embodiment, integration 122 of the subset of pixel detectors 112 in multiplane 130 may be controlled by addressing only pixel detector 116 at the center of multiplane 130 and indicating the size of multiplane 130 based on distance 131 from pixel detector 116 specified in a number of pixels. In this case, integration 122 of all of pixel detectors 112 in multiplane 130 may be controlled to be the same.

In accordance with an illustrative embodiment, integration 122 of a single pixel detector 116, of a plurality of pixel detectors 112, or of all of pixel detectors 112 in array of pixel detectors 110 may be controlled and image 132 generated from the resulting pixel data 124 from the single pixel detector 116, of plurality of pixel detectors 112, or all of pixel detectors 112 in array of pixel detectors 110. For example, without limitation, image 132 may be generated from pixel data 124 by image processing 134 in data processing system 108. Integration 122 by pixel detectors 112 may be controlled and pixel data 124 from pixel detectors 112 obtained by frameless random-access image acquisition 136 implemented in data processing system 108. For example, without limitation, image processing 134 and frameless random-access image acquisition 136 may be implemented by one or more software programs running on data processing system 108.

Image detector controller 102 and image detector readout circuit 106 provide an interface between data processing system 108 and image detector 104 for controlling integration 122 of pixel detectors 110 in image detector 104 and obtaining pixel data 124 from pixel detectors 110 in the manner described.

Image detector controller 102 may comprise computer interface 138. Computer interface 138 may be implemented in any appropriate manner to receive instructions 140 by image detector controller 102 from data processing system 108 and to send image data 144 to data processing system 108 from image detector controller 102. For example, without limitation, computer interface 138 may implemented in the form of direct memory access interface 139, or in any other appropriate manner.

For example, without limitation, instructions 140 may identify pixels 141 corresponding to pixel detectors 116 in image detector 104 from which pixel data 124 will be obtained and may include integration instructions 142 defining integration 122 for the identified pixels. For example, without limitation, instructions 140 may identify pixels 141 by address 143 on address lines or in any other appropriate manner. The pixels identified in instructions 140 may be desired sets of pixel detectors 112 in array of pixel detectors 110 from which pixel data 124 will be used to generate image 132 by data processing system 108. Image data 144 may comprise pixel data 124 obtained from the sets of pixel detectors 112 defined in instructions 140. Image data 144 may be provided to data processing system 108 in a format that is convenient for use by image processing 134 to generate image 132.

Image detector controller 102 may be configured to perform image detector control functions 145 to control image detector 104 in accordance with instructions 140 received from data processing system 108. An example of one possible implementation of image detector controller 102 and image detector control functions 145 performed thereby is described in more detail below with reference to FIG. 5 and FIG. 6.

Image detector readout circuit 106 provides an interface between image detector controller 102 and image detector 104. Image detector readout circuit 106 may comprise a plurality of pixel detector readout circuits 146 comprising one pixel detector readout circuit 148 for each pixel detector 116 in array of pixel detectors 110. An example implementation of pixel detector readout circuit 148 is described in more detail below with reference to FIG. 4.

The illustration of frameless random-access image sensor system 100 in FIG. 1 is not meant to imply physical or architectural limitations to the manner in which illustrative embodiments may be implemented. Other components, in addition to or in place of the ones illustrated, may be used. Some components may be optional. Also, the blocks are presented to illustrate some functional components. One or more of these blocks may be combined, divided, or combined and divided into different blocks when implemented in an illustrative embodiment.

Figure 2:
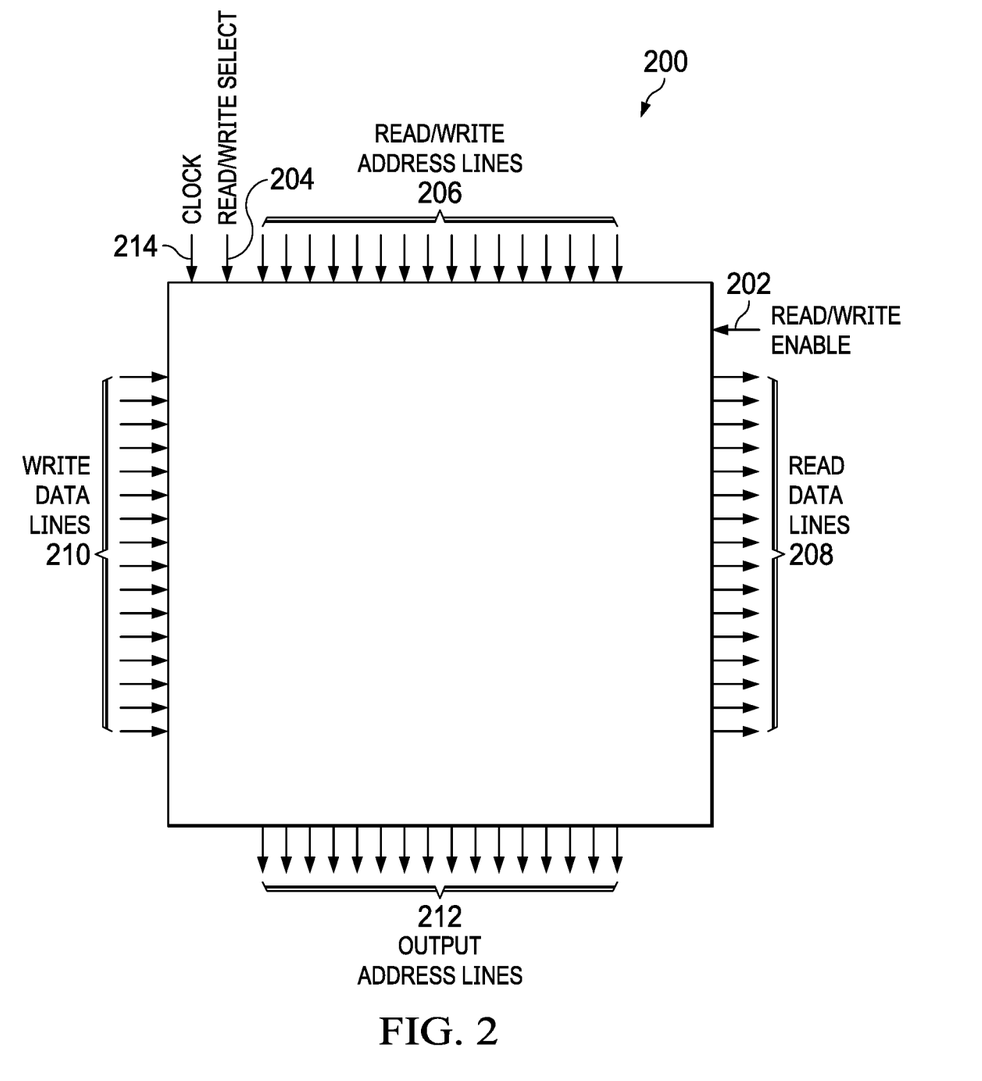
FIG. 2 is an illustration of a frameless random-access image sensor integrated circuit chip in accordance with an illustrative embodiment.

Turning to FIG. 2, an illustration of a frameless random-access image sensor integrated circuit chip is depicted in accordance with an illustrative embodiment. Chip outline 200 illustrates an example of one implementation of a signal interface for image detector controller 102 of frameless random-access image sensor system 100 in FIG. 1.

The interface to an image detector in accordance with an illustrative embodiment may be similar to standard DDR memory used in computers, cameras, mobile phones and FPGAs, among many other electronic devices. A frameless random-access image sensor system in accordance with an illustrative embodiment may be built with this type of interface and physically use the same types of signals and form factor as DDR3 RAM. The various signals provided into and out of chip 200 may can be made in imitation of the similar signals present in standard memory.

Read and write enable 202 may be a signal that causes a read or write to occur at the prescribed address.

Read/write select 204 may select whether to do a read or write.

Read/write address lines 206 may identify the pixel address for reading or writing. These lines are used for both purposes in this example.

Read data lines 208 are the lines that have the sensor and tag data for a selected number of pixels as part of the I/O interface.

Write Data lines 210 are the lines that transmit the control data for each pixel to the frameless random-access image sensor system.

Output address lines 212 are lines that generate the output pixel address for each pixel value being output. This is used as a direct memory access to store the value into a processor's memory that is controlling the frameless random-access image sensor system.

Clock 214 is a global clock signal that generates both an external interface clock associated with interfacing the processor to the sensor and an internal integration clock that controls the pixel and related sensor functions.

Figure 3:
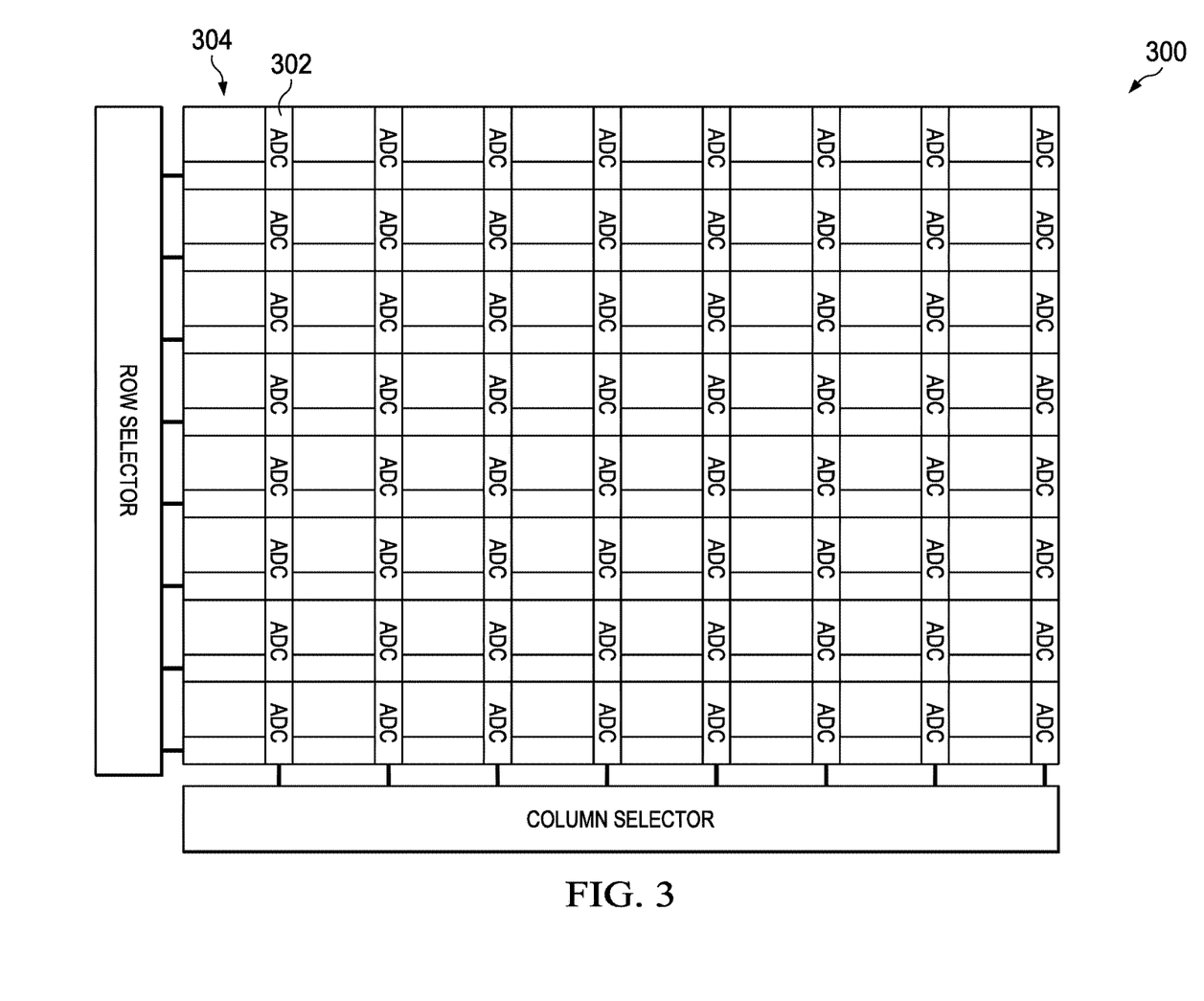
FIG. 3 is an illustration of a block diagram of an image detector for a frameless random-access image sensor system in accordance with an illustrative embodiment.

Turning to FIG. 3, an illustration of a block diagram of an embodiment of an image detector for a frameless random-access image sensor system is depicted in accordance with an illustrative embodiment. Image detector 300 is an example of one implementation of image detector 104 in FIG. 1.

In accordance with an illustrative embodiment, image detector 300 preferably comprises one analog-to-digital converter 302 per pixel 304. This may be accomplished in either a single chip form or multichip form. For example, without limitation, image detector 300 may comprise a digital focal plane array (DFPA) architecture that may overcome the limitations of conventional analog focal plane arrays by performing in-pixel signal digitization. The DFPA enables a larger dynamic range, a faster low-noise all-digital readout, and on-chip processing for reduced sensor SWaP and for the development of novel sensing modalities. The technical approach enables sub-20 mm pitch, low-power designs by employing simple, compact circuits, such as low-power analog-to-digital conversion circuits, as well as low-power counters and shift registers. Illustrative embodiments may use any appropriate image detector architecture including one analog-to-digital converter 302 per pixel 304.

Figure 4:
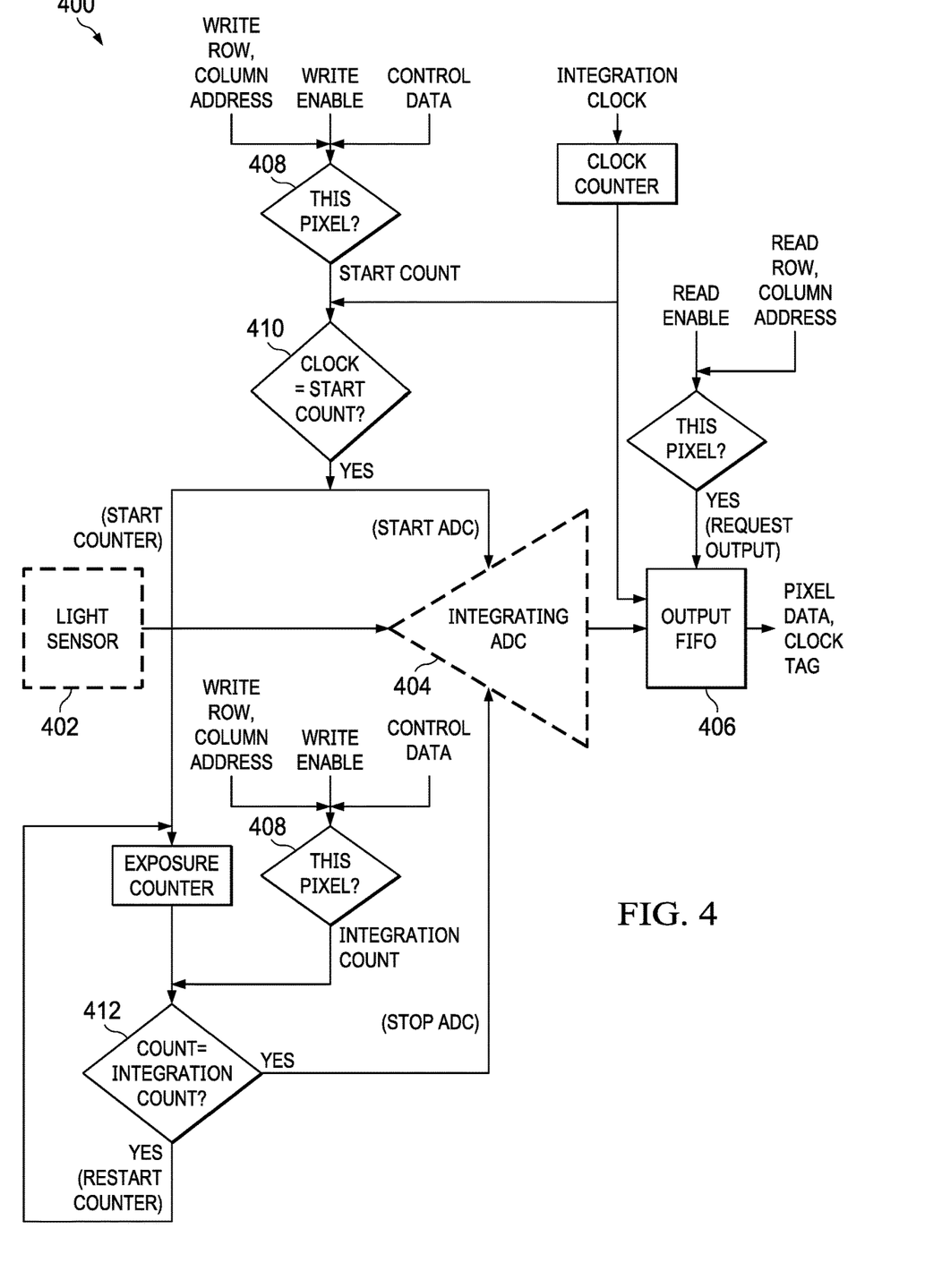
FIG. 4 is an illustration of a pixel detector readout circuit for a frameless random-access image sensor system in accordance with an illustrative embodiment.

Turning to FIG. 4, an illustration of a pixel detector readout circuit for a frameless random-access image sensor system is depicted in accordance with an illustrative embodiment. Pixel detector readout circuit 400 is an example of one implementation of pixel detector readout circuit 148 in FIG. 1.

To enable the features described herein, each pixel may have associated circuitry that implements the functions described. Light sensor 402 is the pixel sensor that produces a signal proportional to the light signal impinging on this pixel. Integrating ADC 404 is the circuitry that creates digital measurements of signals impinging on light sensor 402.

Output FIFO 406 is a first-in-first-out memory that stores the results of integrating ADC 404 and provides buffering in case read requests are delayed. The results will be extracted from FIFO 406 and sent to the read control function within an image detector controller when requested.

This Pixel? 408 forwards portions of the control data when its own pixel is selected with the correct row and column address and read enable is true. Multiplane access may also be implemented in this block. If multiplane access is turned on and this pixel is within a certain distance (the multiplane neighbor distance) of the row and column address and read enable is true, this block will also forward portions of control data to the adjoining functions.

Clock=start count? 410 sends a start ADC integration signal and start counter signal when the clock count value equals the stored start count that came from control data.

Count=integration count? 412 sends a stop ADC integration signal and restart counter signal when the exposure counter value equals the stored start count that came from control data.

A reset signal, not shown, would cause a reset to all store values in the pixel and stop all counters. A start signal, also not shown, would start up the clock counter and turn on the circuits that test for inputs. Reset and start may be used to turn pixel processing on and off in order to save power.

Figure 5:
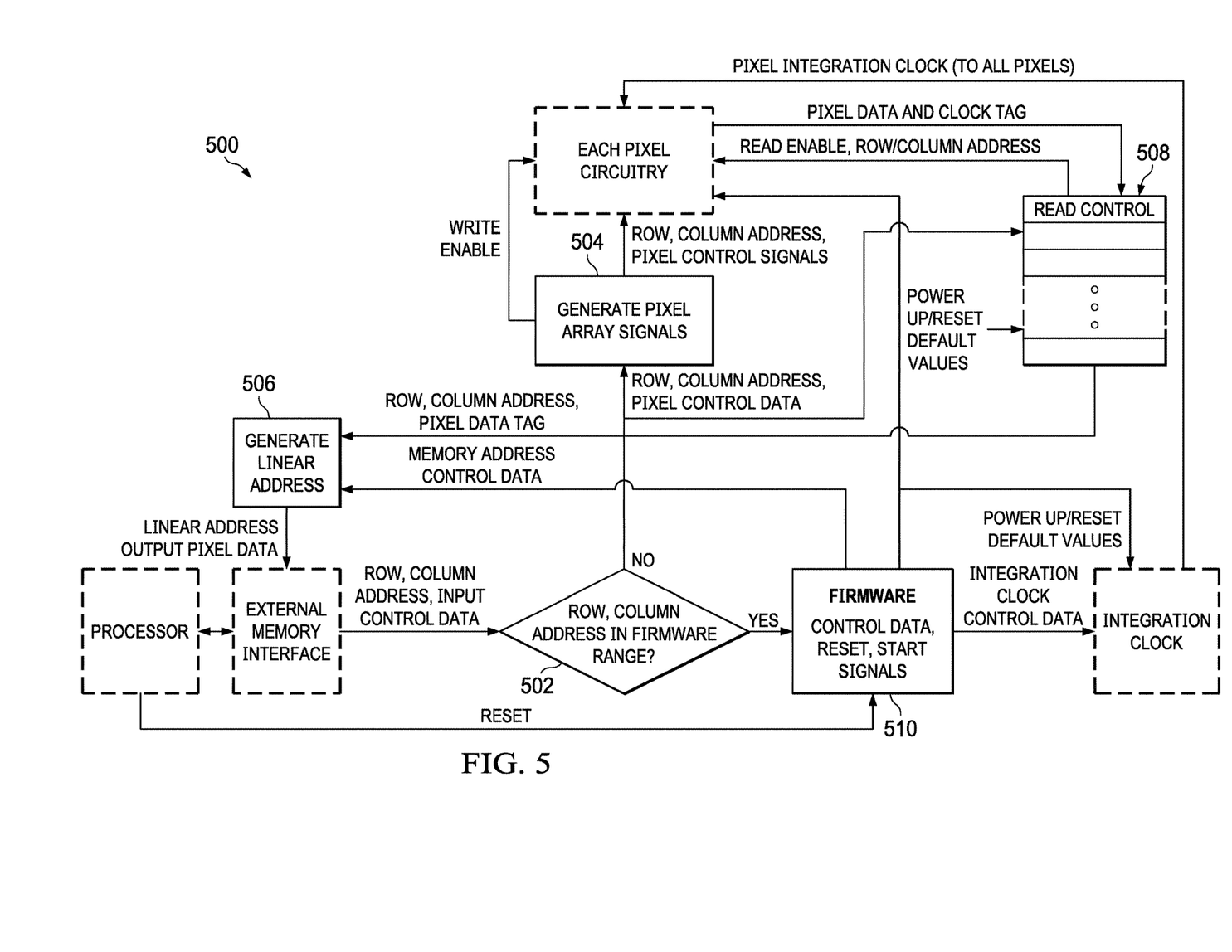
FIG. 5 is an illustration of a block diagram of image detector control functions for a frameless random-access image sensor system in accordance with an illustrative embodiment.

Turning to FIG. 5, an illustration of a block diagram of image detector control functions for a frameless random-access image sensor system is depicted in accordance with an illustrative embodiment. Image detector control functions 500 may be an example of one implementation of image detector control functions 145 implemented in image detector controller 102 in FIG. 1.

Image detector control functions 500 control an image detector based on input from an external processor. The processor communicates to control the FRAIS using row and column addresses, but receives pixel data directly into memory using linear memory addresses. This provides a convenient balance between how image processing views the image sensor (using rows and columns) and how data is stored in the processor memory (using linear addresses). To send control data to the FRAIS, selected non-existent row and column addresses can be used in order to write various items of control data to the firmware to provide the settings needed to control the image sensor. Only the control data particular to the new features that FRAIS has over a typical camera is described herein. Other items required or desirable for real implementation, including area of interest, pixel formats, color options, etc., will be known to those skilled in the art.

Row, Column address in firmware range decision block 502 sends the control data to the firmware if the row, col correspond to the firmware address range. Otherwise the control data is sent to the read control block and pixel array signal block.

Generate pixel array signals block 504 creates the proper signals to the pixel array to transmit the pixel control data to the correct pixel with the write enable signal signaling the validity of the data.

Generate linear address block 506 converts the row and column address from the output FIFO of read control 508 as well as the pixel data and clock counts and forms output data words that contains pixel data+clock tag that gets stored at each computed linear address. The computation can be done several different ways, one standard method is linear address=(row*(# cols)+col)*(output data width)+start address. The output data width is dependent on the pixel format which varies widely depending on the type of image sensor.

Firmware block 510 takes the control data and executes commands based the control data. Thus, it can reset the FRAIS sensor, change the clock frequency, etc. The second task of firmware block 510 is to set up default values for all the FRAIS control block and each pixel upon power up. This setup is usually so that the image sensor operates in a default single frame mode as a normal image sensor would when power is first turned on. Other setup defaults can be used.

Figure 6:
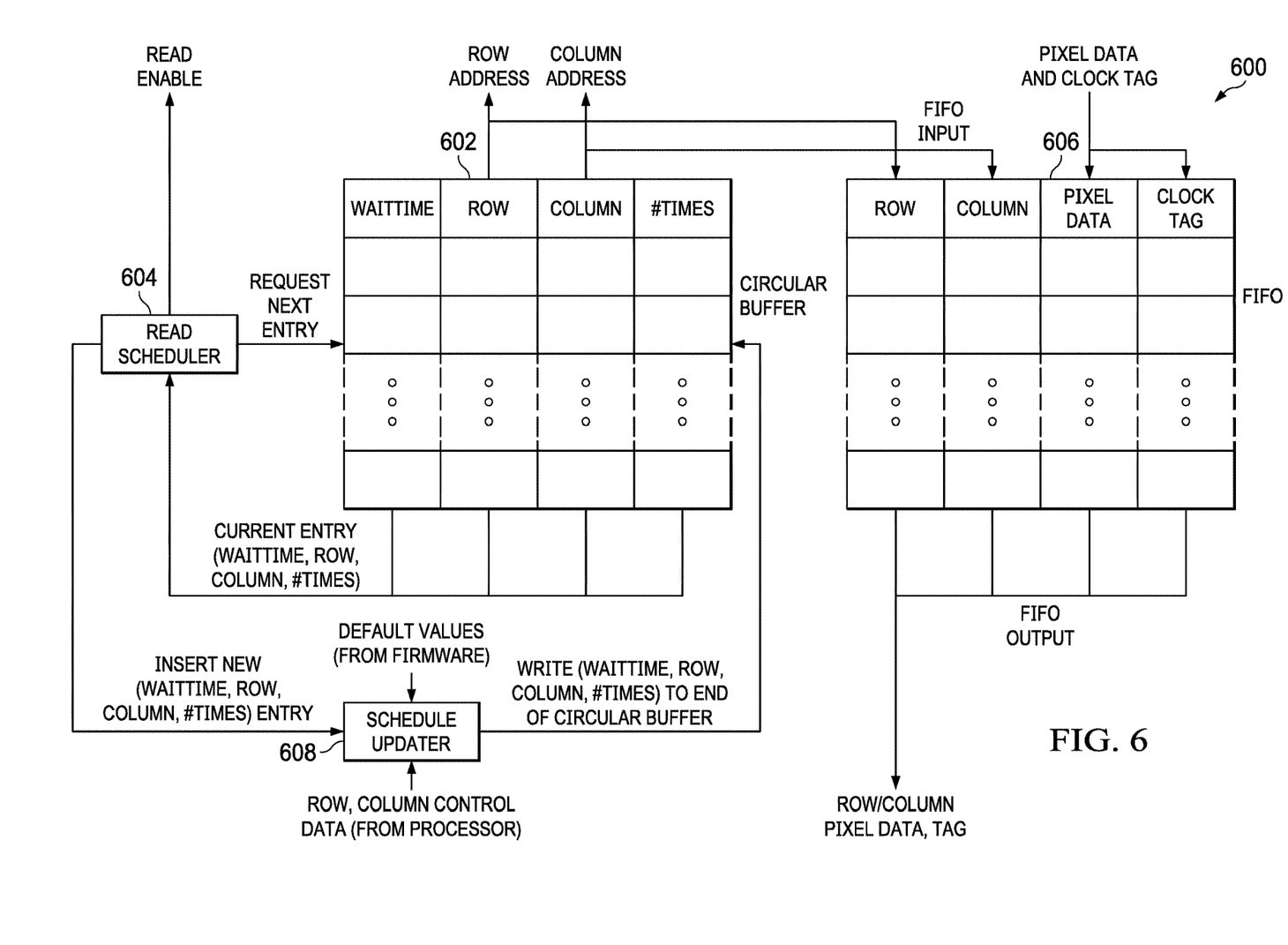
FIG. 6 is an illustration of a read control function for a frameless random-access image sensor in accordance with an illustrative embodiment.

Turning to FIG. 6, an illustration of a read control function for a frameless random-access image sensor is depicted in accordance with an illustrative embodiment. Read control 600 is an example of one implementation of read control 508 in FIG. 5.

Read control function 600 consists of read request circular buffer 602 that contains pixel data being read out of the ROIC as well as control circuitry. Its functions are to read each pixel that has data ready, update its read schedule, and function as a buffer to the write-out interface so that the two different clocking regimes can operate without losing data.

Read scheduler 604 cycles through read request circular buffer 602, reading out the next available read request and sending out a read enable along with its row and column address to the pixel array. Specifically, read scheduler 604 waits for the number of clocks in the wait time value, then sends out the row and column signals corresponding to each read along with a read enable signal. This causes the selected pixel to send its earliest available buffered output value to output FIFO buffer 606 along with the corresponding row and column address. At the same time, read scheduler 604 sends a new read request to scheduler updater 608 if # times count is positive, in this case the wait time, row and column values are the same and # times=# times−1. If # times is negative, read scheduler 604 sends a new read request with all the values the same as the current read request. If # times is zero, no such request is made. Finally, on the next clock, it advances to the next entry in the buffer.

Scheduler updater 608 also operates on read request circular buffer 602, but its job is to update (write) values to the buffer. This happens at the same time as read scheduler 604 is reading out the read requests. Thus, read request circular buffer 602 is typically implemented as a dual read/write memory block with read and write pointers that operate in a circular fashion. Three different sources of input to the schedule updater are: processor (external) input of row, column and control data; read scheduler input of (wait time, row, column, # times); and default values of (wait time, row, column, # times).

Schedule updater 608 cycles through its three input sources and inserts the (wait time, row, column, # times) value at the end of the circular buffer. In the case of the first type of input, when the processor sets a begin and duration (exposure or integration) count for a pixel at (row, column) position (as part of the control data) through its memory interface to FRAIS, the message is also sent to schedule updater 608. The duration count minus one would be put into the wait time value in the buffer along with the row and column addresses. The value # times (also part of the control data) would be inserted as well. Finally, the control data can also include the multiplane access request and size of neighborhood. In this case, the schedule updater would also insert all neighbors of the (row, column) pixel in the read request circular buffer with zero wait time and the same # times as is in the control data. The second item from the read scheduler would be inserted as is. The third item (the default values from the firmware) would also be inserted as is and would typically come from a set of stored values that implement a standard single frame-based access method so that the image sensor would come up from a power reset in a standard configuration.

Figure 7:
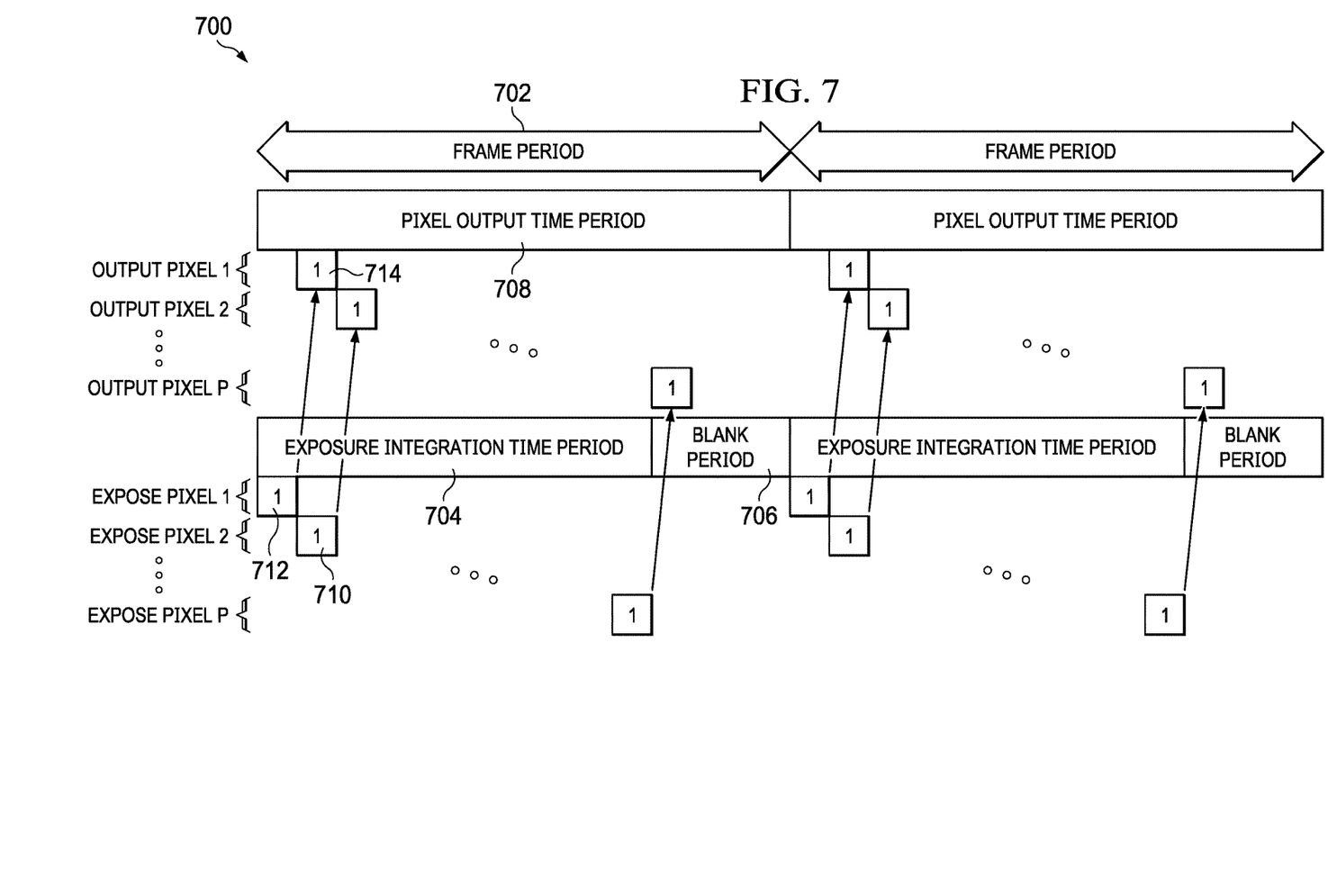
FIG. 7 is an illustration of a timeline for frameless random-access image sensing in accordance with an illustrative embodiment.

Turning to FIG. 7, an illustration of a timeline for operation of a frameless random-access image sensor is depicted in accordance with an illustrative embodiment. Timeline 700 may be implemented, for example, in frameless random-access image sensor system 100 in FIG. 1.

In timeline 700, frame period 702 refers to the time period over which pixel data is obtained from the pixel detectors in an array of pixel detectors comprising a frame. Exposure integration time period 704 refers to time periods during which pixel detectors in the array integrate the output from light sensors in the pixel detectors. Blank period 706 is a period of time between integration time periods for consecutive frames during which no integration takes place. Pixel output time period 708 refers to time periods during which the pixel data generated by the pixel detectors in the array is read out of the pixel detectors.

In timeline 700, the integration period for each pixel detector in the array is the same. The integration period for one pixel detector in the array may begin as soon as the integration period for another one of the pixel detectors in the array is completed. Pixel data is read out from each pixel detector after the integration period for the pixel detector is completed. For example, as illustrated, pixel data may be read from a pixel detector in the array while the integration period for another pixel detector in the array is taking place or during blank period 706.

For example, without limitation, integration period 710 for a second pixel detector in the array may begin after integration period 712 for a first pixel detector in the array is completed. Pixel data may be read from the first pixel detector during time period 714, which corresponds to integration time period 710 for the second pixel detector.

As illustrated in timeline 700, in a frameless random-access image sensor system in accordance with an illustrative embodiment, pixel data may be read from an individual pixel detector in an array as soon as its integration is complete. This is in contrast with a conventional image sensor, in which the pixel data from all of the pixel detectors in the array is read out in the frame following the frame during which integration takes place.

Figure 8:
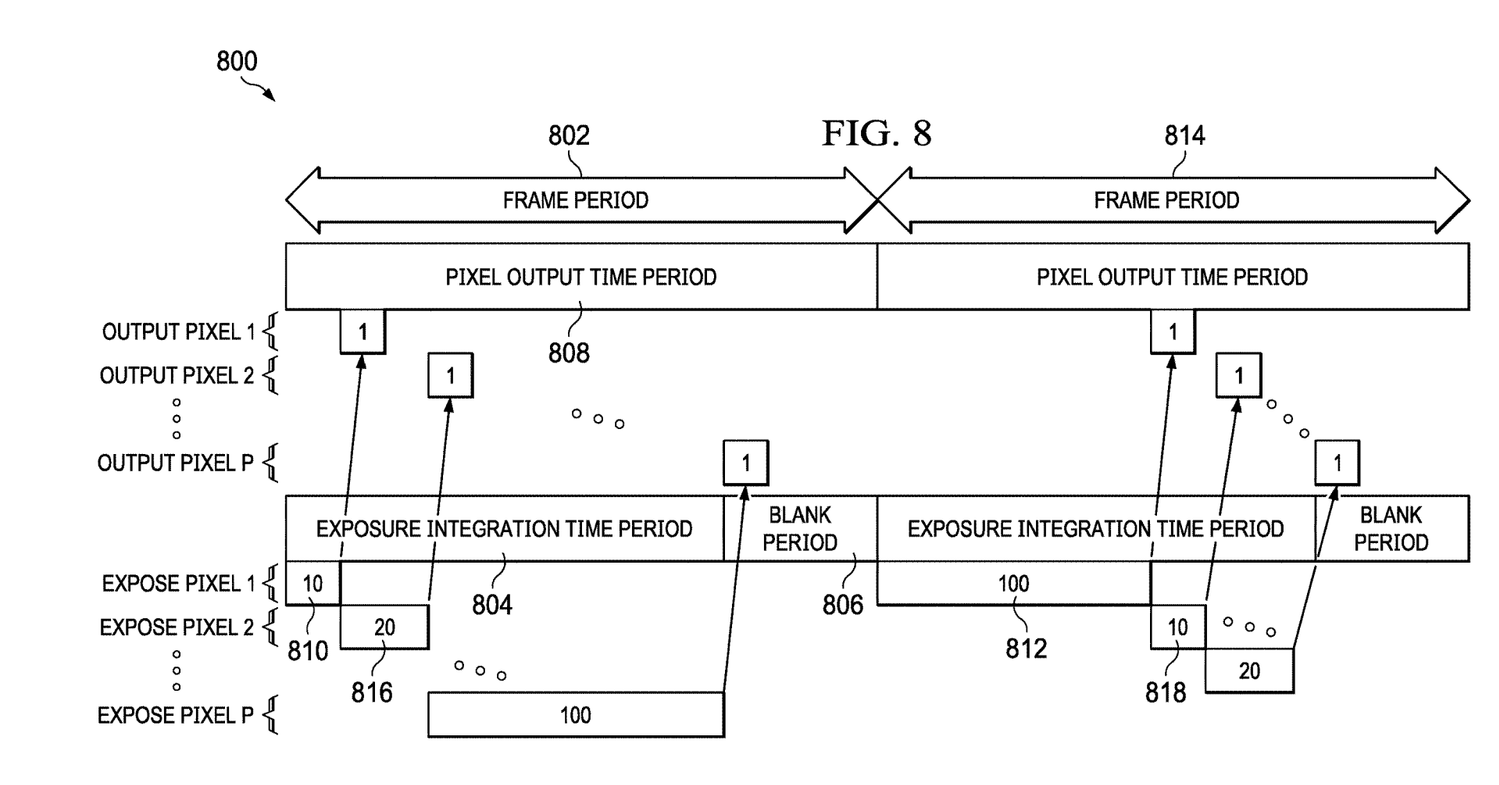
FIG. 8 is an illustration of another timeline for frameless random-access image sensing in accordance with an illustrative embodiment.

Turning to FIG. 8, an illustration of another timeline for operation of a frameless random-access image sensor is depicted in accordance with an illustrative embodiment. Timeline 800 may be implemented, for example, in frameless random-access image sensor system 100 in FIG. 1.

In timeline 800, frame period 802 refers to the time period over which pixel data is obtained from the pixel detectors in an array of pixel detectors comprising a frame. Exposure integration time period 804 refers to time periods during which pixel detectors in the array integrate the output from light sensors in the pixel detectors. Blank period 806 is a period of time between integration time periods for consecutive frames during which no integration takes place. Pixel output time period 808 refers to time periods during which the pixel data generated by the pixel detectors in the array is read out of the pixel detectors.

Timeline 800 illustrates that the integration period for each pixel detector in the array may be different and may change from frame to frame. For example, without limitation, integration period 810 for a first pixel detector in the array may be 10 time units in duration during one frame period 802 and exposure integration time period 812 for the first pixel detector may be 100 time units in duration during next frame period 814. Integration period 816 for a second pixel detector in the array may be 20 time units in duration during one frame 802 and integration time 818 for the second pixel detector may be 10 time units in duration during next frame period 814.

Figure 9:
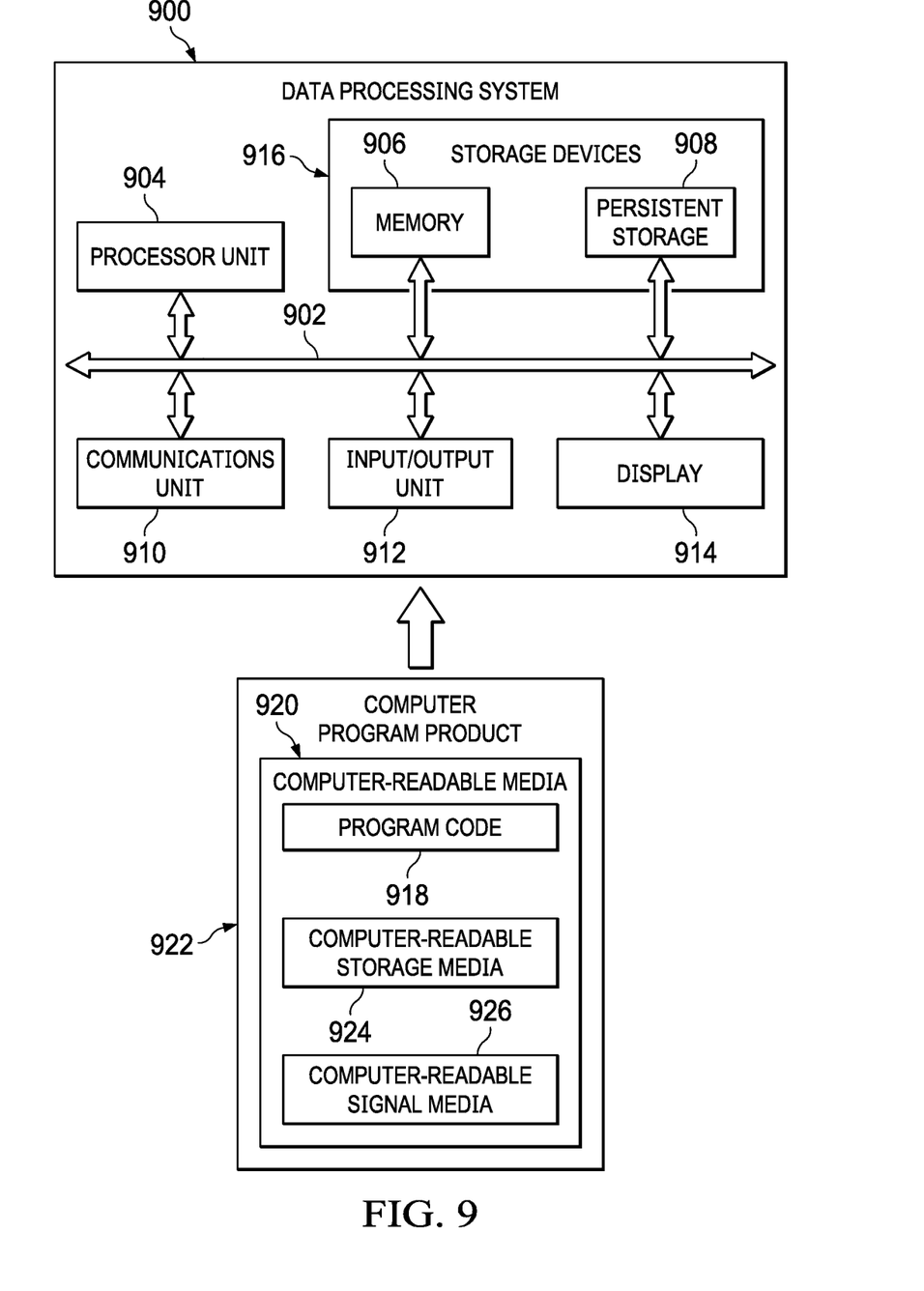
FIG. 9 is an illustration of a block diagram of a data processing system in accordance with an illustrative embodiment.

Turning to FIG. 9, an illustration of a block diagram of a data processing system is depicted in accordance with an illustrative embodiment. Data processing system 900 is an example of one possible implementation of data processing system 108 for frameless random-access image sensor system 100 in FIG. 1.

In this illustrative example, data processing system 900 includes communications fabric 902. Communications fabric 902 provides communications between processor unit 904, memory 906, persistent storage 908, communications unit 910, input/output (I/O) unit 912, and display 914. Memory 906, persistent storage 908, communications unit 910, input/output (I/O) unit 912, and display 914 are examples of resources accessible by processor unit 904 via communications fabric 902.

Processor unit 904 serves to run instructions for software that may be loaded into memory 906. Processor unit 1104 may be a number of processors, a multi-processor core, or some other type of processor, depending on the particular implementation. Further, processor unit 904 may be implemented using a number of heterogeneous processor systems in which a main processor is present with secondary processors on a single chip. As another illustrative example, processor unit 904 may be a symmetric multi-processor system containing multiple processors of the same type.

Memory 906 and persistent storage 908 are examples of storage devices 916. A storage device is any piece of hardware that is capable of storing information, such as, for example, without limitation, data, program code in functional form, and other suitable information either on a temporary basis or a permanent basis. Storage devices 916 also may be referred to as computer-readable storage devices in these examples. Memory 906, in these examples, may be, for example, a random-access memory or any other suitable volatile or non-volatile storage device. Persistent storage 908 may take various forms, depending on the particular implementation.

For example, persistent storage 908 may contain one or more components or devices. For example, persistent storage 908 may be a hard drive, a flash memory, a rewritable optical disk, a rewritable magnetic tape, or some combination of the above. The media used by persistent storage 908 also may be removable. For example, a removable hard drive may be used for persistent storage 908.

Communications unit 910, in these examples, provides for communications with other data processing systems or devices. In these examples, communications unit 910 is a network interface card. Communications unit 910 may provide communications through the use of either or both physical and wireless communications links.

Input/output (I/O) unit 912 allows for input and output of data with other devices that may be connected to data processing system 900. For example, input/output (I/O) unit 912 may provide a connection for user input through a keyboard, a mouse, and/or some other suitable input device. Further, input/output (I/O) unit 912 may send output to a printer. Display 914 provides a mechanism to display information to a user.

Instructions for the operating system, applications, and/or programs may be located in storage devices 916, which are in communication with processor unit 904 through communications fabric 902. In these illustrative examples, the instructions are in a functional form on persistent storage 908. These instructions may be loaded into memory 906 for execution by processor unit 904. The processes of the different embodiments may be performed by processor unit 904 using computer-implemented instructions, which may be located in a memory, such as memory 906.

These instructions are referred to as program instructions, program code, computer usable program code, or computer-readable program code that may be read and executed by a processor in processor unit 904. The program code in the different embodiments may be embodied on different physical or computer-readable storage media, such as memory 906 or persistent storage 908.

Program code 918 is located in a functional form on computer-readable media 920 that is selectively removable and may be loaded onto or transferred to data processing system 900 for execution by processor unit 904. Program code 918 and computer-readable media 920 form computer program product 922 in these examples. In one example, computer-readable media 920 may be computer-readable storage media 924 or computer-readable signal media 926.

Computer-readable storage media 924 may include, for example, an optical or magnetic disk that is inserted or placed into a drive or other device that is part of persistent storage 908 for transfer onto a storage device, such as a hard drive, that is part of persistent storage 908. Computer-readable storage media 924 also may take the form of a persistent storage, such as a hard drive, a thumb drive, or a flash memory, that is connected to data processing system 900. In some instances, computer-readable storage media 924 may not be removable from data processing system 900.

In these examples, computer-readable storage media 924 is a physical or tangible storage device used to store program code 918 rather than a medium that propagates or transmits program code 918. Computer-readable storage media 924 is also referred to as a computer-readable tangible storage device or a computer-readable physical storage device. In other words, computer-readable storage media 924 is a media that can be touched by a person.

Alternatively, program code 918 may be transferred to data processing system 900 using computer-readable signal media 926. Computer-readable signal media 926 may be, for example, a propagated data signal containing program code 918. For example, computer-readable signal media 926 may be an electromagnetic signal, an optical signal, and/or any other suitable type of signal. These signals may be transmitted over communications links, such as wireless communications links, optical fiber cable, coaxial cable, a wire, and/or any other suitable type of communications link. In other words, the communications link and/or the connection may be physical or wireless in the illustrative examples.

In some illustrative embodiments, program code 918 may be downloaded over a network to persistent storage 908 from another device or data processing system through computer-readable signal media 926 for use within data processing system 900. For instance, program code stored in a computer-readable storage medium in a server data processing system may be downloaded over a network from the server to data processing system 900. The data processing system providing program code 918 may be a server computer, a client computer, or some other device capable of storing and transmitting program code 918.

The different components illustrated for data processing system 900 are not meant to provide architectural limitations to the manner in which different embodiments may be implemented. The different illustrative embodiments may be implemented in a data processing system including components in addition to and/or in place of those illustrated for data processing system 900. Other components shown in FIG. 9 can be varied from the illustrative examples shown. The different embodiments may be implemented using any hardware device or system capable of running program code. As one example, data processing system 900 may include organic components integrated with inorganic components and/or may be comprised entirely of organic components excluding a human being. For example, a storage device may be comprised of an organic semiconductor.

In another illustrative example, processor unit 904 may take the form of a hardware unit that has circuits that are manufactured or configured for a particular use. This type of hardware may perform operations without needing program code to be loaded into a memory from a storage device to be configured to perform the operations.

For example, when processor unit 904 takes the form of a hardware unit, processor unit 904 may be a circuit system, an application specific integrated circuit (ASIC), a programmable logic device, or some other suitable type of hardware configured to perform a number of operations. With a programmable logic device, the device is configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. With this type of implementation, program code 918 may be omitted, because the processes for the different embodiments are implemented in a hardware unit.

In still another illustrative example, processor unit 904 may be implemented using a combination of processors found in computers and hardware units. Processor unit 904 may have a number of hardware units and a number of processors that are configured to run program code 918. With this depicted example, some of the processes may be implemented in the number of hardware units, while other processes may be implemented in the number of processors.

In another example, a bus system may be used to implement communications fabric 902 and may be comprised of one or more buses, such as a system bus or an input/output bus. Of course, the bus system may be implemented using any suitable type of architecture that provides for a transfer of data between different components or devices attached to the bus system.

Additionally, communications unit 910 may include a number of devices that transmit data, receive data, or both transmit and receive data. Communications unit 910 may be, for example, a modem or a network adapter, two network adapters, or some combination thereof. Further, a memory may be, for example, memory 906, or a cache, such as that found in an interface and memory controller hub that may be present in communications fabric 902.

The flowcharts and block diagrams described herein illustrate the architecture, functionality, and operation of possible implementations of systems, methods, and computer program products according to various illustrative embodiments. In this regard, each block in the flowcharts or block diagrams may represent a module, segment, or portion of code, which comprises one or more executable instructions for implementing the specified logical function or functions. It should also be noted that, in some alternative implementations, the functions noted in a block may occur out of the order noted in the figures. For example, the functions of two blocks shown in succession may be executed substantially concurrently, or the functions of the blocks may sometimes be executed in the reverse order, depending upon the functionality involved.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other desirable embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method of random-access image sensing, comprising:
   receiving instructions identifying a pixel detector in an array of pixel detectors and integration instructions for the pixel detector;
   controlling integration by the pixel detector as defined by the integration instructions to generate pixel data by the pixel detector, wherein integration by each pixel detector in the array of pixel detectors is controlled individually; and
   reading the pixel data from the pixel detector.

2. The method of claim 1, wherein the array of pixel detectors comprises a focal plane array.

3. The method of claim 1, wherein each pixel detector in the array of pixel detectors comprises a light sensor and an integrating analog-to-digital converter.

4. The method of claim 1, wherein receiving instructions identifying the pixel detector comprises receiving an address identifying the pixel detector on address lines.

5. The method of claim 1, wherein controlling integration by the pixel detector comprises controlling an integration time and an integration period.

6. The method of claim 1, wherein controlling integration by the pixel detector comprises writing an integration value to a pixel detector readout circuit for the pixel detector.

7. The method of claim 1, wherein:
   receiving instructions identifying the pixel detector in the array of pixel detectors comprises receiving instructions identifying the pixel detector in the array of pixel detectors and a distance from the pixel detector;
   controlling integration by a plurality of pixel detectors within the distance from the pixel detector in the array of pixel detectors as defined by the integration instructions to generate the pixel data by the plurality of pixel detectors; and
   reading the pixel data from the plurality of pixel detectors.

8. The method of claim 1 further comprising:
   controlling integration by a first pixel detector in the array of pixel detectors for a first integration period during a first frame period to generate first pixel data;
   controlling integration by a second pixel detector in the array of pixel detectors for a second integration period during the first frame period to generate second pixel data, wherein the second integration period is different from the first integration period;
   controlling integration by the first pixel detector in the array of pixel detectors for a third integration period during a second frame period to generate third pixel data, wherein the third integration period is different from the first integration period; and
   reading the first pixel data and the third pixel data from the first pixel detector and reading the second pixel data from the second pixel detector.

9. An apparatus, comprising:
   an image detector controller configured to receive instructions from a data processing system identifying a pixel detector in an array of pixel detectors and integration instructions for the pixel detector, control integration by the pixel detector as defined by the integration instructions to generate pixel data by the pixel detector, wherein integration by each pixel detector in the array of pixel detectors is controlled individually, and send the pixel data from the pixel detector to the data processing system.

10. The apparatus of claim 9 further comprising an image detector comprising the array of pixel detectors, wherein the array of pixel detectors comprises a focal plane array.

11. The apparatus of claim 9 further comprising an image detector comprising the array of pixel detectors, wherein each pixel detector in the array of pixel detectors comprises a light sensor and an integrating analog-to-digital converter.

12. The apparatus of claim 9, wherein the image detector controller is configured to control an integration time of the pixel detector and an integration period of the pixel detector.

13. The apparatus of claim 9 further comprising a computer interface for the image detector controller, wherein the image detector controller is configured to receive the instructions from the data processing system via the computer interface and to send the pixel data as image data to the data processing system via the computer interface.

14. The apparatus of claim 13, wherein the computer interface comprises a direct memory access interface.

15. The apparatus of claim 9 further comprising a pixel detector readout circuit for each pixel detector in the array of pixel detectors and wherein the image detector controller is configured to control integration by the pixel detector by writing an integration value to the pixel detector readout circuit for the pixel detector.

16. An apparatus, comprising:
- an image detector controller configured to address an individual pixel detector in an image detector comprising an array of pixel detectors to control integration by the pixel detector and to read pixel data from the pixel detector;
- a computer interface for the image detector controller, wherein the image detector controller is configured to receive instructions for obtaining image data from the image detector from a data processing system via the computer interface and to send the image data to the data processing system via the computer interface; and
- a pixel detector readout circuit for each pixel detector in the array of pixel detectors, wherein the image detector controller is configured to control integration by the pixel detector by writing an integration value to the pixel detector readout circuit for the pixel detector.

17. The apparatus of claim 16 further comprising the image detector comprising the array of pixel detectors, wherein the array of pixel detectors comprises a focal plane array.

18. The apparatus of claim 16 further comprising the image detector comprising the array of pixel detectors, wherein each pixel detector in the array of pixel detectors comprises a light sensor and an integrating analog-to-digital converter.

19. The apparatus of claim 16, wherein the image detector controller is configured to control an integration time of the pixel detector and an integration period of the pixel detector.

20. The apparatus of claim 16, wherein the computer interface comprises a direct memory access interface.

* * * * *